United States Patent [19]

Boyacigiller

[11] Patent Number: 4,752,700
[45] Date of Patent: Jun. 21, 1988

[54] APPARATUS FOR PRE-DEFINING CIRCUIT CHARACTERISTICS

[75] Inventor: Ziya G. Boyacigiller, Hayward, Calif.

[73] Assignee: Maxim Integrated Products, Inc., Sunnyvale, Calif.

[21] Appl. No.: 9,051

[22] Filed: Jan. 27, 1987

Related U.S. Application Data

[63] Continuation of Ser. No. 697,200, Jan. 31, 1985, abandoned.

[51] Int. Cl.$^4$ .......................... H03K 5/24; H03K 3/01; G05F 1/46
[52] U.S. Cl. .................................. 307/297; 307/264; 307/362
[58] Field of Search ............... 307/350, 264, 363, 362, 307/359, 296 R, 318, 297

[56] References Cited

U.S. PATENT DOCUMENTS 3,217,184 11/1965 Lach .................................. 307/362
4,382,198 5/1983 Ishijima et al. ..................... 307/555

Primary Examiner—John Zazworsky
Attorney, Agent, or Firm—Blakely Sokoloff, Taylor & Zafman

[57] ABSTRACT

An integrateable circuit is disclosed which allows selection between pre-defined and user-defined characteristics. The circuit utilizes a single input terminal for both selection and definition by a user. In a preferred embodiment, a comparator senses whether a user-supplied voltage at this input terminal is at a logic low level or not. It the voltage at this input terminal is at a logic level low, an internal voltage proportional to a pre-defined characteristic is enabled. If the voltage at this input terminal is not at a logic low level, the internal voltage proportional to the pre-defined characteristic is disconnected and a characteristic defined by the user, its value proportional to the user-supplied voltage present at the input terminal, is connected and activated.

3 Claims, 3 Drawing Sheets

APPARATUS FOR PRE-DEFINING CIRCUIT CHARACTERISTICS

This is a continuation of application Ser. No. 697,200, filed Jan. 31, 1985, now abandoned.

FIELD OF THE INVENTION

The present invention is concerned with circuits which allow implementation of both internally pre-selected and external user selectable characteristics in electronic circuits. More particularly, the present invention pertains to a circuit which allows selection between pre-defined characteristics built into the circuit, and user-defined characteristics which may be selected by the user and communicated to the circuit by means of an indicia on an input terminal.

The present invention makes it possible to manufacture a circuit with fixed characteristics, for example a +5 volt DC reference, whose output can also be optionally defined by the user to any other voltage between the supply voltage levels, such as 1.3 volts. Moreover, the circuit inherently detects the type of application and changes internal circuit configuration to produce the desired level output via the use of a single input terminal, thus eliminating the need to use an extra input terminal that would normally be required to achieve this function.

THE PRIOR ART

Circuits manufactured today have characteristics that are either fixed or user-definable. Some circuits also allow selection of either pre-defined characteristics or user-defined characteristics. This results in more versatility for the circuit since the same circuit may be used in applications requiring either fixed characteristics or user-definable characteristics.

Electrical circuits work with electrical quantities such as voltages, currents, frequency, charge, etc. The magnitudes of these quantities are important since they may, for example, establish circuit parameters or may be used to represent information. In digital circuits, a high level voltage can be used to represent a true logical value, and a low level voltage can be used to represent a "false" logical value. In contrast to the two levels encountered in binary digital circuits, analog circuits may use an infinitely variable number of voltage levels between two limit points to represent proportionally larger or smaller quantities of a characteristic or parameter.

There is also a need to provide circuitry which is capable of defining reference levels for electrical quantities. Some of these reference levels are so frequently used that they become standards of the industry. For example, +5 volts DC is a voltage level commonly used for power supplies in most digital circuits. Similarly, +15 and −15 volts DC are commonly used for analog circuit power supply voltage levels. Another common group of circuits that generate a voltage level are voltage references. Common voltage reference outputs are +2.5, 5 and 10 volts. For many other applications uncommon voltage levels can be required, such as 1.3 volts for a circuit working from a 1.5 volt battery.

Conventionally, manufacturers supply dedicated circuits with characteristics that cover the common (or standard) levels. For the uncommon applications, a different set of circuits with undedicated and user-selectable characteristics are usually offered. For example, voltage references are offered either as dedicated +5 or 10 volt references or as undedicated references which may be set to a specific voltage level by using, for example, a simple resistive voltage divider.

Circuits which combine several characteristics are also known. Such circuits are commonly equipped with inputs to select between a pre-defined characteristic and a user selectable characteristic to adjust the user selectable quantity. Conventionally, to achieve this function in a circuit, two input terminals would be required. First, a digital input terminal is necessary to define the type of application (i.e., if the circuit is to be used with pre-defined characteristics, or with user-defined characteristics). Second, an analog input terminal is used as a means to provide the user-defined characteristic.

As circuits and functions become more complex it becomes desirable to reduce the number of input and output terminals without having a corresponding loss in functionality. Therefore, it is desirable to combine as many functions as possible on a circuit without over-use of input or output terminals.

SUMMARY OF THE INVENTION

A circuit is disclosed which allows selection between pre-selected circuit characteristics and user-selectable characteristics, and further allows a user to specify the user-selectable characteristic, via a single input terminal.

In a preferred embodiment, the characteristic is DC voltage, which may be converted to current, frequency, etc., by known means. A DC input voltage present at a single input terminal is sensed and compared to the negative DC supply voltage in a comparator circuit.

If the DC input voltage is equal to the negative DC supply voltage, a switching network connects an internally-set reference voltage to a voltage follower or source follower amplifier. If the DC input voltage is greater than the negative DC supply voltage, the switching network connects the DC input voltage at the single input terminal to the source follower.

The output of the source follower circuit may be made available at an output terminal or may be connected to a device, such as a voltage to current converter or voltage to frequency converter, to supply a circuit parameter other than voltage to an output terminal.

In a preferred embodiment the entire circuit may be fabricated on a single semiconductor substrate using CMOS technology.

OBJECTS AND ADVANTAGES OF PRESENT INVENTION

It is an object of the present invention to provide a circuit which can select between user-selectable and pre-defined characteristics.

It is a further object of the invention to provide a circuit which can choose between pre-defined and user-selectable characteristics by the use of one single input terminal.

Yet another object of the present invention is to provide such a circuit which is more convenient to use.

Yet another object of the present invention is to provide such a circuit which is easier to assemble into larger electronic circuits.

Still other objects and attendant advantages of the present invention will become apparent to those of ordinary skill in the art from a reading of the following detailed description in conjunction with the accompanying drawings and appended claims.

DETAILED DESCRIPTION OF A PREFERRED EMBODIMENT

Figure 1:
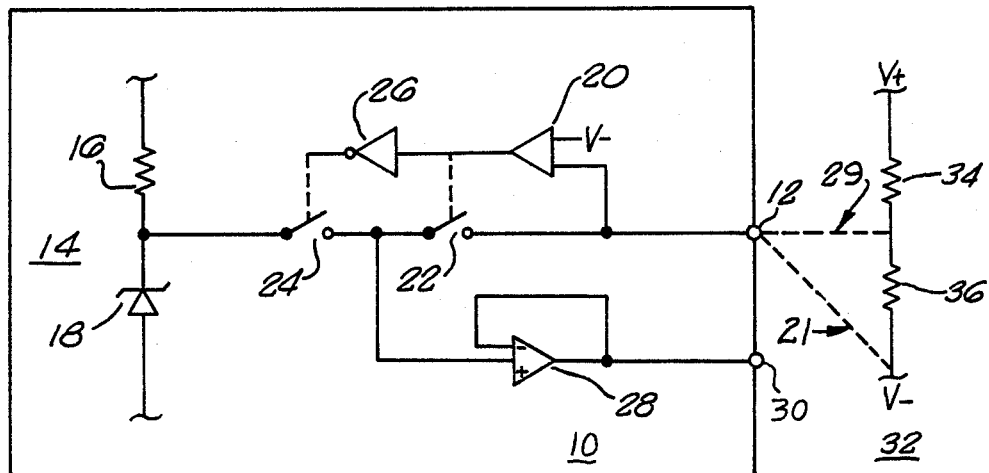
FIG. 1 is a block diagram of a preferred embodiment of the present invention.

Referring first to FIG. 1, an over-simplified block diagram of a circuit of the present invention is depicted.

The circuit 10 allows selection between a pre-defined characteristic and a user-selectable characteristic provided at its single input terminal 12. Throughout the discussion which follows, the characteristic referred to, by way of example only, will be a constant DC voltage. Nevertheless, the present invention will be understood by those of ordinary skill in the art to encompass other circuit parameters and characteristics, such as current, frequency, etc. Those skilled in the art will readily understand how such a DC voltage may be converted to either current, frequency, or other common parameters and characteristics found in electronic circuits.

Circuit 10 allows selection between a user-selectable voltage which may be placed on input terminal 12 or an internally preset voltage generated, for example, by a voltage reference source such as network 14 composed of resistor 16 and zener diode 18.

The circuit 10 operates by comparing at comparator 20 the voltage at input terminal 12 with the negative DC supply voltage (V−), supplied to the circuit. If the voltage at the input terminal 12, and thus at comparator 20 input is equal to the negative supply voltage (shown via dashed line 21), the output of comparator 20 causes switch 22 to open and switch 24, via inverter 26 to close. With switch 22 open and switch 24 closed, the output of internal voltage network 14 is connected to the input of voltage follower amplifier 28.

If, however, the voltage at input terminal 12 is greater than the negative supply voltage (shown via dashed line 29), the output of comparator 20 closes switch 22 and opens switch 24 via inverter 26. In this case the user-supplied voltage appearing at input terminal 12 is connected to the input of voltage follower amplifier 28.

The output of voltage follower amplifier 28 may either be connected to output terminal 30, as shown, or may be used to drive such commonly employed circuits as a voltage to frequency converter or a voltage to current converter.

In the embodiment of the present invention depicted in FIG. 1, the voltage supplied to input terminal 12 may be a voltage derived from the positive and negative DC supply voltage via a voltage divider 32 composed of, for example, resistors 34 and 36. Circuit 10 may be disposed entirely on a single semiconductor substrate as an integrated circuit as shown diagrammatically by box 37.

Those of ordinary skill in the art will readily recognize that for a greater degree of accuracy some means of feedback may be employed. Such an embodiment is depicted in FIG. 2 to which attention is now drawn.

Figure 2:
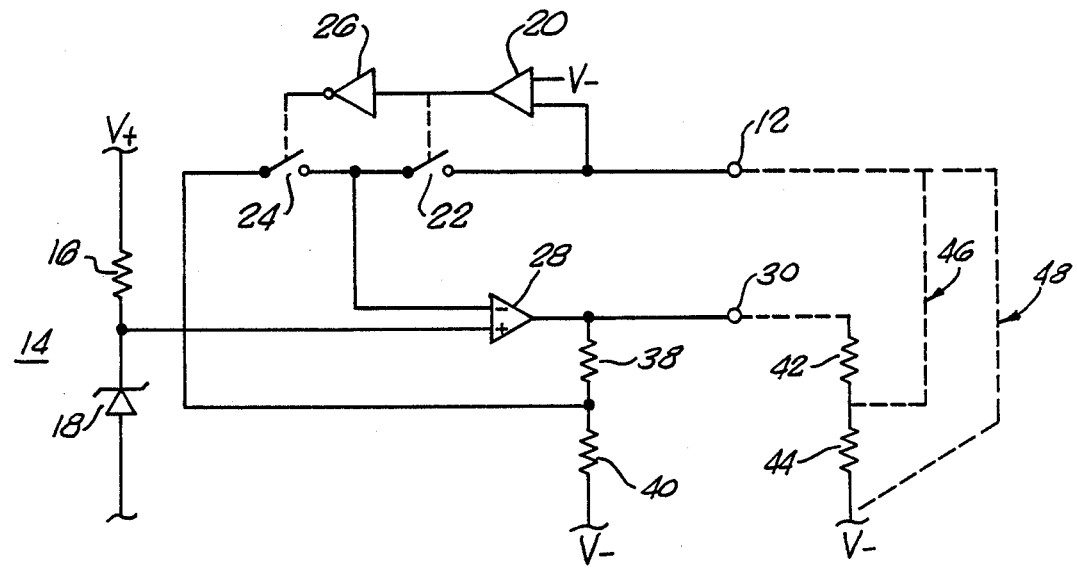
FIG. 2 is a block diagram of another preferred embodiment of the present invention using feedback for improved accuracy and stability.

As in the circuit of FIG. 1, the comparator 20 of FIG. 2 compares a voltage placed at input terminal 12 with the negative supply voltage. The outputs of comparator 20 and inverter 26 drive switches 22 and 24 to select the pre-defined voltage or the user-supplied voltage in the manner described with respect to FIG. 1. However, in the embodiment of FIG. 2, the connections to amplifier 28 are made in a feedback configuration.

The output of reference voltage network 14 is supplied to the non-inverting input of amplifier 28. If input terminal 12 is at the negative supply voltage (shown at dashed line 48), the output of amplifier 28 is returned to the inverting input of amplifier 28 via switch 24 and internal resistor network consisting of resistors 38 and 40. As is well understood, the gain of amplifier 28 will be determined by the values of resistors 38 and 40. If, however, output terminal 30 has resistors 42 and 44 connected to it, and the connection to input terminal 12 is made as shown by dashed line 46, the output of amplifier 28 is returned to its inverting input via a feedback loop consisting of resistors 42 and 44, line 46 and switch 22.

Figure 3:
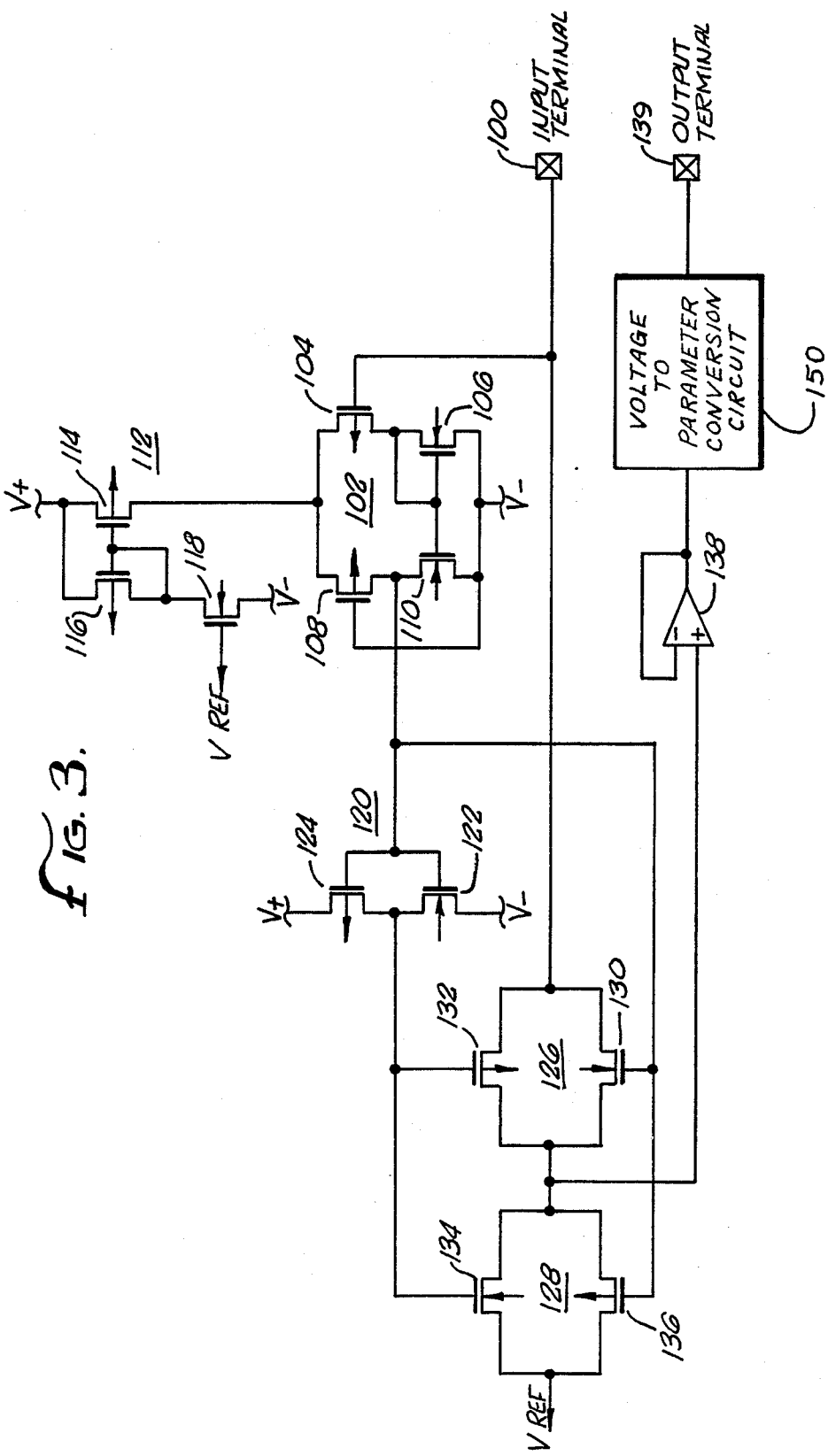
FIG. 3 is a schematic diagram of the embodiment of FIG. 1.

Referring now to FIG. 3, a schematic diagram of the embodiment of FIG. 1, input terminal 100 is connected to comparator circuit 102. Comparator circuit 102 consists of P-Channel device 104, N-Channel device 106, P-Channel device 108 and N-Channel device 110. N-Channel devices 106 and 110 are matched pairs and P-Channel devices 104 and 108 are almost matched pairs; P-Channel device 104 is sized to be slightly larger than P-Channel device 108.

Comparator 102 is fed by constant current source 112 consisting of P-Channel devices 114 and 116 and N-Channel device 118. The amount of current supplied by constant current source 112 is determined by the voltage which is placed, with respect to the negative DC supply voltage, on the gate of N-Channel device 118. The voltage reference source 14 of FIG. 1 will function satisfactorily as this voltage reference source.

Comparator 102 functions as follows. Constant current source 112 supplied a constant total current to device 104 and 106 on one leg and device 108 and device 110 on the other leg of comparator 102. The current to both legs would be equal when the gate of P-Channel device 104 connected to input terminal 100 is at the negative supply voltage is these devices were matched. However, since device 104 is sized to the slightly larger than device 108, a slight imbalance is created allowing more current to flow through devices 104 and 106 than flows through devices 108 and 110. Therefore, the common connection of P-Channel device 108 and N-Channel device 110 will tend to be at a lower voltage than the common connection between P-Channel device 104 and N-Channel device 106. Therefore, the output of the comparator, the common junction between N-Channel device 110 and P-Channel device 108, is low and forces the input of inverter 120 to be low, and its output to be high.

If, however, the voltage at terminal 100, and therefore the voltage at the gate of P-Channel device 104, rises above the negative supply voltage, P-Channel device 104 tends to turn off. When it does so, the voltage at the commonly-connected gates of N-Channel devices 106 and 110 moves towards the negative DC supply voltage, turning off those devices. Therefore, the voltage at the output of the comparator rises and presents a high level to the input of inverter 120, thereby making its output low.

Inverter 120, connected to the output of comparator 102, consists of N-Channel device 122 and P-Channel device 124, which are connected in series, and have their gates connected together. If the input voltage to the gates is low, near or at the negative supply voltage, N-Channel device 122 will be off and P-Channel device 124 will be on. The output of inverter 120, the common source/drain connection of devices 122 and 124, will thus be high. If the input is high, N-Channel device 122 will be on, P-Channel device 124 will be off, and the output will thus be low.

Switches 126 and 128 are composed of N-Channel device 130, P-Channel device 132 and N-Channel device 134 and P-Channel device 136, respectively. The gates of P-Channel device 132 and N-Channel device 134 are connected to the output of inverter 120. The gates of N-Channel device 130 and P-Channel device 136 are connected to the common connection between the output of comparator 102 and the input of inverter 120.

In the first case, in which the negative supply voltage is at terminal 100 (to choose the pre-defined characteristic) and thus forces the input to inverter 120 to be low and its output to be high, N-Channel device 130 connected to the input of the inverter and P-Channel device 132 connected to the output of the inverter will be turned off and N-Channel device 134 connected to the output of the inverter and P-Channel device 136 connected to the input of the inverter will tend to be turned on. Switch 126 will be opened and switch 128 will be closed.

By similar reasoning when the input to inverter 120 is high and its output is low switch 128 will be opened and switch 126 will be closed.

Depending upon whichever one of switches 126 and 128 is closed, either the reference voltage (Vref) or the user-supplied voltage at input terminal 100 will be supplied to amplifier 138, configured as a source follower. The output of amplifier 138 is connected to output terminal 139 and presents an output voltage essentially equal to either the reference voltage (Vref) or the user-supplied voltage on input terminal 100. The output of amplifier 138 may be connected to a device, such as a voltage-to-current converter or voltage-to-frequency converter to supply a circuit parameter other then voltage to output terminal 139. Such a voltage to parameter conversion circuit is illustrated at reference numeral 150.

Figure 4:
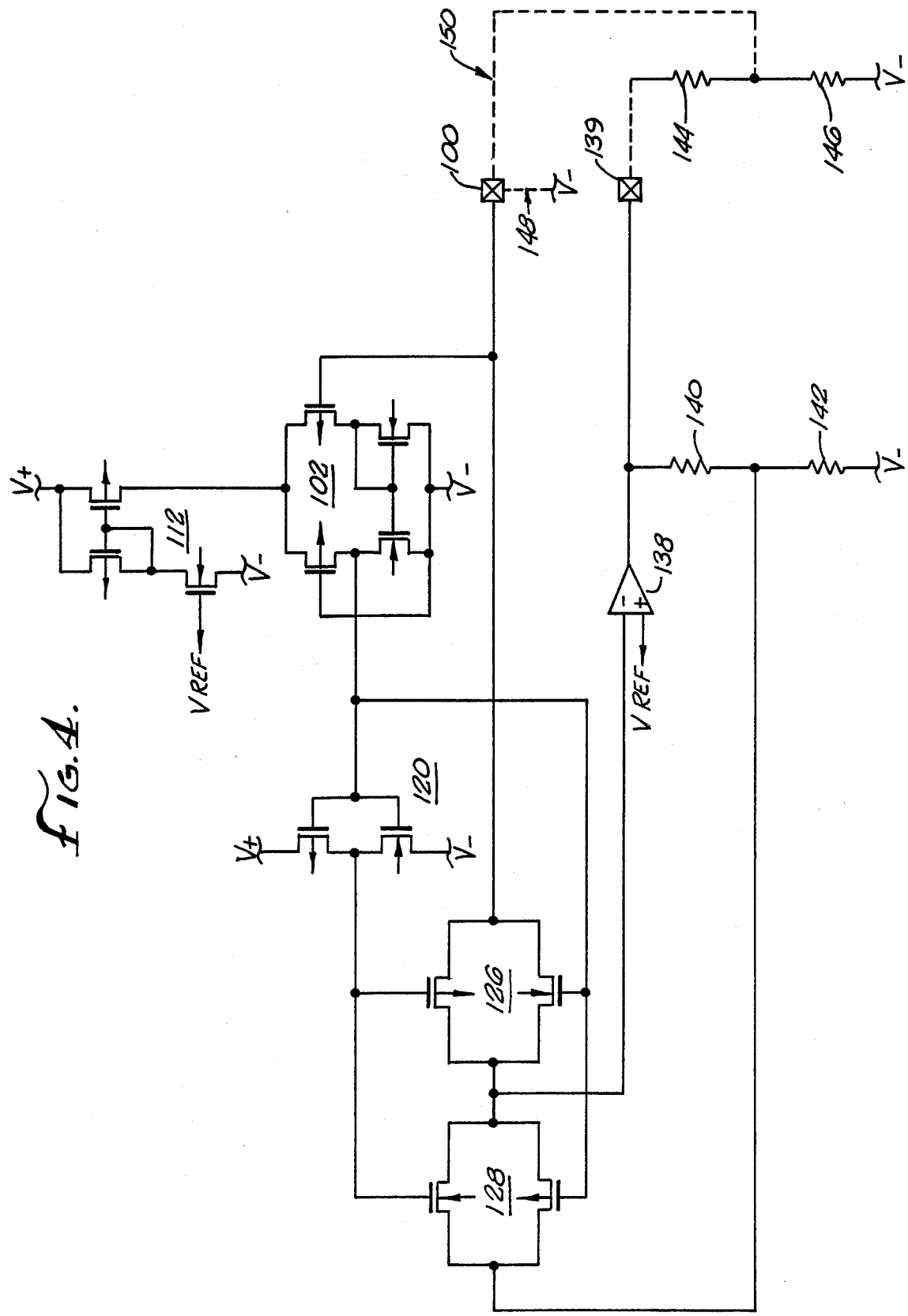
FIG. 4 is a schematic diagram of the embodiment of FIG. 2.

Referring now to FIG. 4, it will be observed by those of ordinary skill in the art that the embodiment shown therein is in most respects identical to the embodiment of FIG. 3. The connections between switches 126 and 128 and the buffer amplifier and output terminals are different, reflecting the use of feedback.

In the embodiment of FIG. 4, the principal of feedback is used to help stabilize and control the accuracy of the output at terminal 139. In this embodiment, a choice is made between the internal feedback loop consisting of resistor 140 and resistor 142, and a user-selectable external feedback loop consisting of resistors 144 and 146.

In the embodiment of FIG. 4, the non-inverting input of amplifier 138 is connected to the reference voltage Vref, supplied for example, by the zener diode resistor network 14 of FIGS. 1 and 2. The internal feedback loop consists of resistors 140 and 142, their common junction being connected to switch 128. The external feedback loop consists of resistors 144 and 146, their common junction being connected to switch 126 through the input terminal 100.

In the embodiment of FIG. 4, if the input terminal 100 is connected to the negative DC supply voltage, as indicated by dashed line 148, switch 128 will be closed and switch 126 will be open. Therefore, the internal feedback loop through amplifier 138 will be enabled and the voltage appearing at the output terminal 139 will be determined by the ratio of the sum of the values of resistors 140 and 142, divided by the value of resistor 1 and 2, all multiplied by the value of the reference voltage (Vref).

If, however, the input terminal 100 is connected to the junction of resistors 144 and 146 as shown by dashed line 150, switch 126 will be closed and switch 128 will be open, establishing the external feedback loop through amplifier 138. The voltage at output terminal 139 will therefore be determined by the ratio of the sum of the values of resistors 144 and 146 divided by the value of resistor 142, all multiplied by the value of the reference voltage (Vref).

Those of ordinary skill in the art will recognize that, while the preferred CMOS embodiments described herein utilize N-Channel and P-Channel enhancement devices, other devices, such as depletion devices or bipolar function transistors could be utilized. Furthermore, such persons will recognize that, even though not shown in FIGS. 3 and 4, the substrates of all N-Channel devices are connected to the negative DC supply voltage and those of the P-Channel devices are connected to the positive DC supply voltage.

What is claimed is:

1. An integrated circuit for providing an output parameter having its value established by either an internal fixed pre-defined voltage or an externally-supplied, user-selectable fixed voltage, including:

an input for providing an externally-supplied first fixed voltage, an internal voltage source providing a second fixed voltage, comparator means for comparing said first fixed voltage with an internally established third fixed voltage, said comparator means having an output which assumes a first state if said first fixed voltage is less than or equal to said internally established third fixed voltage and which assumes a second state if said first fixed voltage is greater than said internally established third fixed voltage, voltage to parameter conversion means for supplying said output parameter to an output, a first switch, connected between said input terminal and said voltage to parameter conversion means, said switch having a control element connected to and responsive to the output of said comparator such that said switch is open if said output is in said first state and closed if said output is in said second state, a second switch, connected between said internal voltage source and said voltage to parameter conversion means, said second switch having a control element connected to and responsive to the output of said comparator means such that said second switch is closed if said output is in said first state and open if said output is in said second state.

2. An integrated voltage regulator circuit for providing an output voltage having a value established by either an internal, pre-defined voltage level or an externally-supplied, user-selectable, voltage level, including:

an internal voltage amplifier circuit having an inverting input, a non-inverting input, and an output, said non-inverting input connected to a first fixed internal voltage source, its output connected to an output terminal and to an internal ratio feedback network for returning a portion of the voltage output of said internal voltage amplifier circuit to its inverting input through a first switch, an input terminal connected to said inverting input of said voltage amplifier circuit through a second switch, a comparator, having a first input connected to said input terminal, a second input connected to a second fixed internal voltage level, and an output connected to control elements for said first and second switches such that said first switch is on when said comparator is in a first state and said second switch is on when said comparator is in a second state, wherein a voltage equal to or less than said second fixed interval voltage level at said input terminal causes said internal ratio feedback network to be connected to the inverting input of said voltage amplifier circuit and a voltage greater than said second fixed internal voltage level at said input terminal causes said input terminal to be connected to said inverting input of said voltage amplifier circuit.

3. An integrated voltage regulator circuit for providing an output voltage having a value established by either an internal, pre-defined voltage level or an externally-supplied, user-selectable, voltage level, including:

an internal voltage amplifier circuit having an inverting input, a non-inverting input, and an output, said non-inverting input connected to a first fixed internal voltage source, its output connected to an output terminal and to one end of a voltage divider, the other end of said voltage divider connected to a second internal voltage level, said voltage divider including a first and a second resistance and a node therebetween, said internal voltage amplifier circuit further having its inverting input connected to said node between said first and second resistances through a first switch, an input terminal connected to the inverting input of said voltage amplifier circuit through a second switch, a comparator, having a first input connected to said input terminal, a second input connected to said second fixed internal voltage level, and an output connected to control elements for said first and second switches such that said first switch is on when said comparator is in a first state and said second switch is on when said comparator is in a second state, wherein a voltage equal to or less than said second fixed interval voltage level at said input terminal causes said node to be connected to the inverting input of said voltage amplifier circuit and a voltage greater than said second fixed internal voltage level at said input terminal causes said input terminal to be connected to the inverting input of said voltage amplifier circuit.

* * * * *